United States Patent
Chen et al.

(10) Patent No.: US 8,237,174 B2
(45) Date of Patent: Aug. 7, 2012

(54) LED STRUCTURE

(75) Inventors: Peng-Ren Chen, Taoyuan (TW);
Hsueh-Hsing Liu, Taoyuan (TW);
Jen-Inn Chyi, Taoyuan (TW)

(73) Assignee: National Central University, Taoyuan (TW)

( * ) Notice: Subject to any disclaimer, the term of this patent is extended or adjusted under 35 U.S.C. 154(b) by 239 days.

(21) Appl. No.: 12/776,834

(22) Filed: May 10, 2010

(65) Prior Publication Data
US 2011/0272719 A1    Nov. 10, 2011

(51) Int. Cl.
*H01L 27/15* (2006.01)
*H01L 31/12* (2006.01)
*H01L 33/00* (2010.01)

(52) U.S. Cl. ..... 257/79; 257/15; 257/200; 257/E21.006; 257/E21.053; 257/E21.17; 257/E21.126; 257/E21.127; 257/E21.352

(58) Field of Classification Search ............ 257/15, 257/79, 200, 201, 212, 249, E21.006, E21.053, 257/E21.17, E21.126, E21.127, E21.352
See application file for complete search history.

(56) References Cited

U.S. PATENT DOCUMENTS

| 6,356,032 | B1* | 3/2002 | Suzuki et al. | 315/169.3 |
| 7,256,541 | B2* | 8/2007 | Birnstock et al. | 313/502 |
| 2008/0048557 | A1* | 2/2008 | Birnstock et al. | 313/504 |
| 2010/0187564 | A1* | 7/2010 | Farmer et al. | 257/103 |

FOREIGN PATENT DOCUMENTS

| TW | 579608 | 3/2004 |
| TW | I240443 | 9/2005 |

* cited by examiner

*Primary Examiner* — David Nhu
(74) *Attorney, Agent, or Firm* — Muncy, Geissler, Olds & Lowe, PLLC

(57) ABSTRACT

The present invention discloses an LED structure, wherein an N-type current spreading layer is interposed between N-type semiconductor layers to uniformly distribute current flowing through the N-type semiconductor layer. The N-type current spreading layer includes at least three sub-layers stacked in a sequence of from a lower band gap to a higher band gap, wherein the sub-layer having the lower band gap is near the substrate, and the sub-layer having the higher band gap is near the light emitting layer. Each sub-layer of the N-type current spreading layer is expressed by a general formula $In_xAl_yGa_{(1-x-y)}N$, wherein $0 \leq x \leq 1$, $0 \leq y \leq 1$, and $0 \leq x+y \leq 1$.

9 Claims, 5 Drawing Sheets

LED STRUCTURE

FIELD OF THE INVENTION

The present invention relates to an LED (Light Emitting Diode) structure, particularly to an LED structure able to improve current distribution.

BACKGROUND OF THE INVENTION

LED (Light Emitting Diode) has advantages of compactness, longer lifespan, superior color performance, lower power consumption, and higher light emitting efficiency. Under the trend of environmental protection, LED has massively replaced the conventional lighting sources. Since an important breakthrough of gallium nitride LED was made in 1993 in Japan, gallium nitride LED has become a hot field of research around the world.

Refer to FIG. 1 for a conventional LED structure. The conventional LED structure 10 comprises a substrate 11, an N-type semiconductor layer 12, a light emitting layer (or called the active layer) 13, a P-type semiconductor layer 14, a P-type current spreading layer 15, a first electrode 16 and a second electrode 17. The N-type semiconductor layer 12 is formed on the substrate 11. The light emitting layer 13 is formed on the N-type semiconductor layer 12. The P-type semiconductor layer 14 is formed on the light emitting layer 13. The P-type current spreading layer 15 is formed on the P-type semiconductor layer 14. The first electrode 16 is formed on the P-type current spreading layer 15. The second electrode 17 is formed on the exposed surface of the N-type semiconductor layer 12. The N-type semiconductor layer 12 may be an N-type gallium nitride (GaN) layer. The P-type semiconductor layer 14 may be a P-type gallium nitride (GaN) layer. The light emitting layer 13 may be an indium gallium nitride (InGaN) layer.

Between the first electrode 16 and the P-type semiconductor layer 14 of a planar or large-area LED, there is a greater sheet resistance likely to generate current crowding. Thus, the P-type current spreading layer 15 is interposed there between to improve current crowding and increase light emitting efficiency.

The conventional LED adopts a P-type current spreading layer 15 made of a nickel-gold or chromium-gold alloy to increase uniformity of current distribution. However, the nickel-gold alloy and the chromium-gold alloy have inferior light permeability. Thus, the thickness thereof must be constrained to hundreds of Å to obtain better light permeability. Nevertheless, a stable film is hard to be attained if the thickness thereof is too thin. Therefore, it is difficult to keep the balance between light permeability and current distribution uniformity.

In recent years, TCO (Transparent Conductive Oxide) films have gradually replaced the abovementioned metal alloy film to function as the P-type current spreading layer 15, whereby the light permeability is improved. Although the TCO film has 90% light permeability and above, the ohmic contact between the TCO film and the P-type semiconductor layer 14 is poor, which is likely to generate current crowding and lower the total light emitting efficiency. There are many prior arts for improving poor ohmic contact. For an example, R.O.C. patent No. 579608 disclosed a "Light Emitting Element for Forming Electrode and Method for Fabricating the Same", wherein a metallic or metal alloy ohmic contact point is formed on a P-type gallium nitride semiconductor layer firstly, and a light-permeable oxide film is formed on them next. For another example, R.O.C. patent No. I240443 disclosed an "LED and Method for Fabricating the Same", wherein a superlattice stress contact layer is formed on a P-type gallium nitride semiconductor layer firstly, and a transparent conductive layer is formed over them next.

How to achieve uniform current distribution under high current injection is always a focal topic in the field of large-area gallium nitride LED and solid-state illumination. The P-type current spreading layer 15 can indeed improve the current crowding in the P-type semiconductor layer 14 and lower the sheet resistance thereof. However, current crowding is also affected by the N-type semiconductor layer 12. The current crowding in the N-type region causes non-uniform carrier injection to the light emitting active region 13 and results in overheating in local area in the element, which reduces the internal quantum efficiency and decreases the light emitting efficiency.

SUMMARY OF THE INVENTION

One objective of the present invention is to provide an LED structure to enhance current spreading in the N-type region and lower sheet resistance thereof.

To achieve the abovementioned objective, the present invention provides an N-type current spreading layer between the N-type semiconductor layers to uniformly distribute the current flowing through the N-type semiconductor layers. The LED structure of the present invention comprises a substrate, an N-type semiconductor layer, a light emitting layer, a P-type semiconductor layer and at least one N-type current spreading layer. The N-type semiconductor layer is formed on the substrate. The light emitting layer is formed on the N-type semiconductor layer. The P-type semiconductor layer is formed on the light emitting layer. The N-type current spreading layer includes at least three sub-layers having a general formula $In_xAl_yGa_{(1-x-y)}N$, wherein $0 \leq x \leq 1$, $0 \leq y \leq 1$, and $0 \leq x+y \leq 1$. The sub-layers are stacked in a sequence of from a lower band gap to a higher band gap, and wherein the sub-layer having a lower band gap is near the substrate and the sub-layer having a higher band gap is near the light emitting layer.

The N-type current spreading layer can provide a higher electron concentration, increase uniformity of current distribution, and lower sheet resistance. Further, the present invention can reduce the operation voltage of the LED and improve light emitting efficiency thereof.

The technical contents of the present invention are described in detail with the embodiments in cooperation with the drawings below.

BRIEF DESCRIPTION OF THE DRAWINGS

The embodiments are described in accompany with the following drawings.

DETAILED DESCRIPTION OF THE PREFERRED EMBODIMENTS

The present invention provides at least one N-type current spreading layer between the N-type semiconductor layers to uniformly distribute current in the lateral sides of the N-type semiconductor layers, whereby the N-type semiconductor layers have a higher electron concentration and lower sheet resistance. Here, it should be explained that the "P-type" or "N-type" in the P-type and N-type current spreading layers does not mean the current spreading layer is doped with P-type or N-type atoms but is referred to the current spreading layer is arranged in a P-type or N-type region. The materials used by the current spreading layer of the present invention will be further described thereinafter. The technical contents of the present invention will be demonstrated in accompany with the drawings below.

Figure 2:
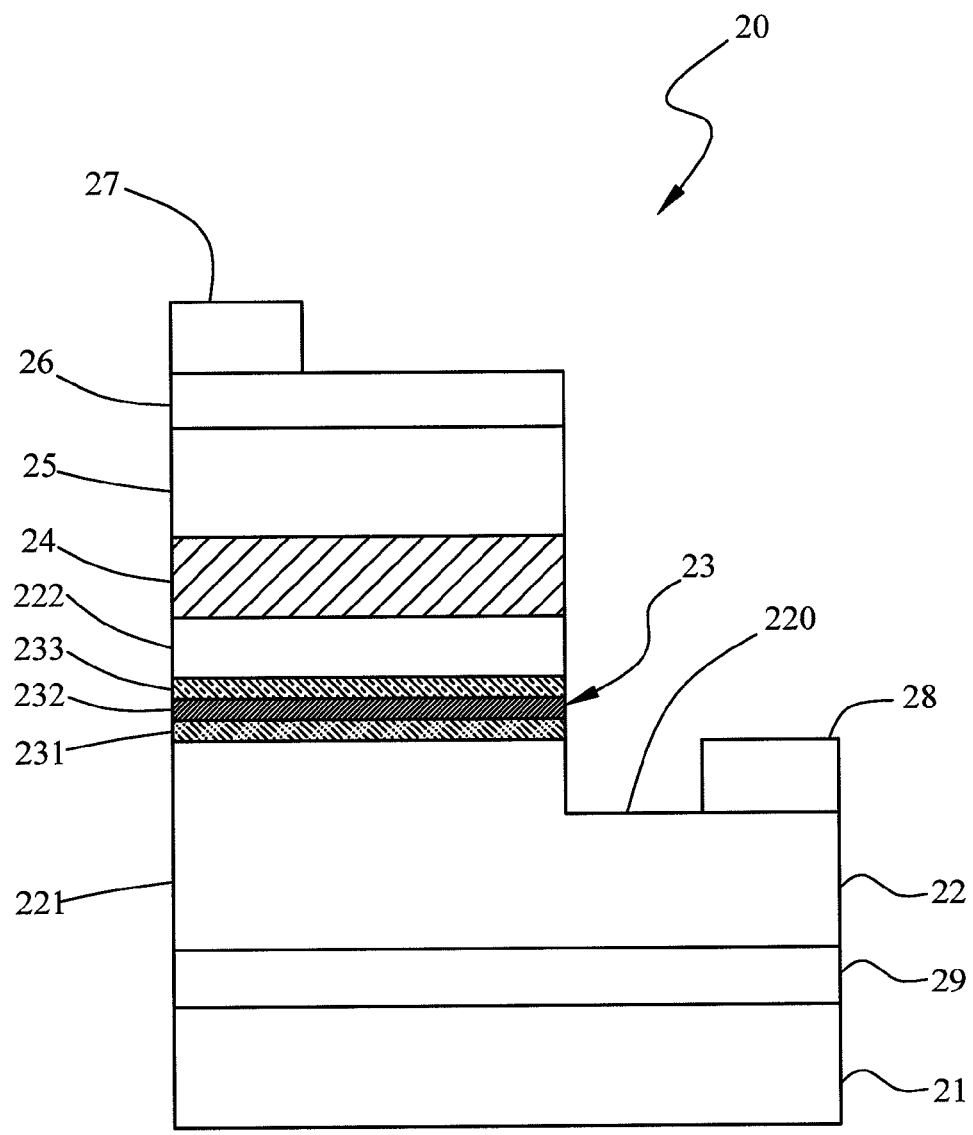
FIG. 2 is a diagram schematically showing an LED structure according to one embodiment of the present invention.

Refer to FIG. 2 a diagram schematically showing an LED structure according to one embodiment of the present invention. The LED structure 20 of the present invention comprises a substrate 21, an N-type semiconductor layer 22, an N-type current spreading layer 23, a light emitting layer 24, a P-type semiconductor layer 25, a P-type current spreading layer 26, a first electrode 27 and a second electrode 28. The N-type semiconductor layer 22 is formed on the substrate 21. The N-type current spreading layer 23 is formed in the N-type semiconductor layer 22 (a region between the substrate 21 and the light emitting layer 24). The light emitting layer 24 is formed on a portion of the N-type semiconductor layer 22, and the surface of the revealed N-type semiconductor layer 22 becomes an exposed surface 220. The P-type semiconductor layer 25 is formed on the light emitting layer 24. The P-type current spreading layer 26 is formed on the P-type semiconductor layer 25. The first electrode 27 is formed on the P-type current spreading layer 26. The second electrode 28 is formed on the exposed surface 220 of the N-type semiconductor layer 22.

The N-type current spreading layer 23 provides a higher electron concentration and thus lowers the sheet resistance thereof, whereby the current flowing through the N-type semiconductor layer 22 is uniformly distributed. The N-type current spreading layer 23 includes at least three sub-layers, and the sub-layers are stacked in a sequence of from a lower band gap to a higher band gap, wherein the sub-layer having the lower band gap is near the substrate 21 and the sub-layer having the higher band gap is near the light emitting layer 24. Each sub-layer of the N-type current spreading layer 23 can be expressed by a general formula $In_xAl_yGa_{(1-x-y)}N$, wherein $0 \leq x \leq 1$, $0 \leq y \leq 1$, and $0 \leq x+y \leq 1$. Different x values and y values can obtain materials having different band gaps. In one embodiment, the N-type current spreading layer 23 has an indium gallium nitride ($In_xGa_{1-x}N$, $0 \leq x \leq 1$) layer 231, a gallium nitride (GaN) layer 232 and an aluminum gallium nitride ($Al_xGa_{1-x}N$, $0 \leq x \leq 1$) layer 233 in a sequence of from the lower band gap to the higher band gap, and the three layers form a heterojunction structure. The lattice mismatch in the junction of the indium gallium nitride layer 231 and the gallium nitride layer 232 causes polarization in the piezoelectric field and generate a higher concentration of electrons. A spontaneous polarization occurs in the junction of the gallium nitride layer 232 and the aluminum gallium nitride layer 233 and increases the concentration of electrons. Thus the concentration of electrons in the N-type current spreading layer 23 is greatly increased. Moreover, the N-type current spreading layer 23 is located in the N-type semiconductor layer 22 and is above the junction of the second electrode 28 and the N-type semiconductor layer 22, i.e. above the lowest position of the exposed surface 220, to achieve a better current distribution effect.

In the present invention, the epitaxy of the N-type current spreading layer 23 may be but not limited to a silicon-doped or un-doped structure. In one embodiment, the N-type current spreading layer 23 has a thickness of 1 nm-200 nm. In a fabrication process, a first N-type semiconductor layer 221 is formed on the substrate 21 before the N-type current spreading layer 23 is formed. Next, the N-type current spreading layer 23 is formed on the first N-type semiconductor layer 221 according to a sequence of from the lower band-gap sub-layer to the higher band-gap sub-layer. Then, a second N-type semiconductor layer 222, the light emitting layer 24, the P-type semiconductor layer 25, etc. are formed sequentially.

In one embodiment, the substrate 21 may be aluminum oxide ($Al_2O_3$, sapphire), aluminum nitride (AlN), gallium nitride (GaN), magnesium oxide (MgO), zinc oxide (ZnO), lithium gallate ($LiGaO_3$), lithium aluminate ($LiAlO_3$), silicon carbide (SiC), and silicon (Si).

In one embodiment, the light emitting layer 24 may be an MQW (Multi-Quantum Well) structure. In the present invention, each of the N-type semiconductor layer 22, the light emitting layer 24 and the P-type semiconductor layer 25 is made of a III-V group material containing gallium nitride, which can be expressed by a general formula $In_xAl_yGa_{(1-x-y)}N$, wherein $0 \leq x \leq 1$, $0 \leq y \leq 1$, and $0 \leq x+y \leq 1$. The GaN-containing compounds may be fabricated with any appropriate method. The method for fabricating the GaN-containing compounds is not only limited to an MOCVD (Metal Organic Chemical Vapor Deposition) method, but also an HVPE (Hydride Vapor Phase Epitaxy) method, a CVPE (Chloride Vapor Phase Epitaxy) method, and an MBE (Molecular Beam Epitaxy) method.

In one embodiment, a buffer layer 29 is formed between the substrate 21 and the N-type semiconductor layer 22. The buffer layer 29 is made of a material selected from a group consisting of nitride and zinc oxide (ZnO), which has a lattice constant similar to the substrate 21 or the N-type semiconductor layer 22. In one embodiment, the buffer layer 29 has a thickness of 1 nm-2000 nm.

The P-type current spreading layer 26 is used to increase the current distribution in the P-type region. In one embodiment, the P-type current spreading layer 26 can be a TCO (Transparent Conductive Oxide) layer. The TCO layer is made of a material selected from a group consisting of ITO (indium tin oxide), CTO (cadmium tin oxide), ATO (antimony tin oxide), AZO (aluminum (doped) zinc oxide), IZO (indium (doped) zinc oxide), ZnO (zinc oxide), InO (indium oxide), SnO (tin oxide), CAO (copper aluminum oxide), and SCO (strontium copper oxide).

Each of the first electrode 27 and the second electrode 28 is made of a material suitable for electrodes. In one embodiment, the material of each of the first electrode 27 and the second electrode 28 may be but not limited to a material selected from a group consisting of indium (In), tin (Sn), zinc (Zn), nickel (Ni), gold (Au), chromium (Cr), cobalt (Co), cadmium (Cd), aluminum (Al), vanadium (V), silver (Ag), titanium (Ti), wolfram (W), platinum (Pt), palladium (Pd), rhodium (Rh), ruthenium (Ru), a binary alloy of two of the abovementioned metals, or an alloy containing more than two of the abovementioned metals. In one embodiment, each of the first electrode 27 and the second electrode 28 has a thickness of 1-10000 nm.

Figure 3:
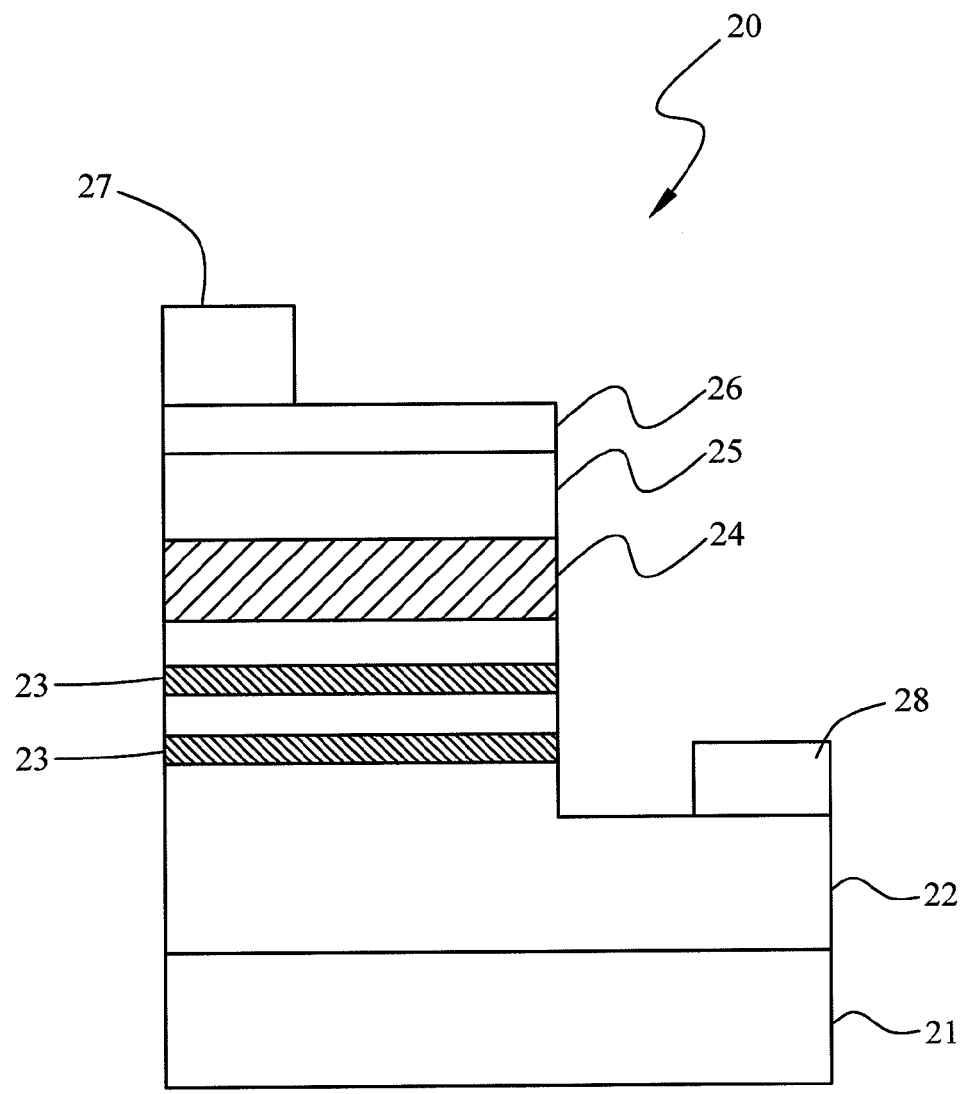
FIG. 3 is a diagram schematically showing an LED structure according to another embodiment of the present invention.

Refer to FIG. 3 a diagram schematically showing an LED structure according to another embodiment of the present invention. This embodiment is different from the previous embodiment in that the N-type semiconductor layer 22 includes a plurality of N-type current spreading layers 23. The N-type current spreading layers 23 are arranged between the light emitting layer 24 and the junction of the N-type semiconductor layer 22 and the second electrode 28. The N-type current spreading layers 23 neither contact with each other nor contact with the light emitting layer 24, with N-type semiconductor interposed therebetween. The N-type current spreading layers 23 can enhance the current distribution in the N-type region and promote the total light emitting efficiency.

Figure 1:
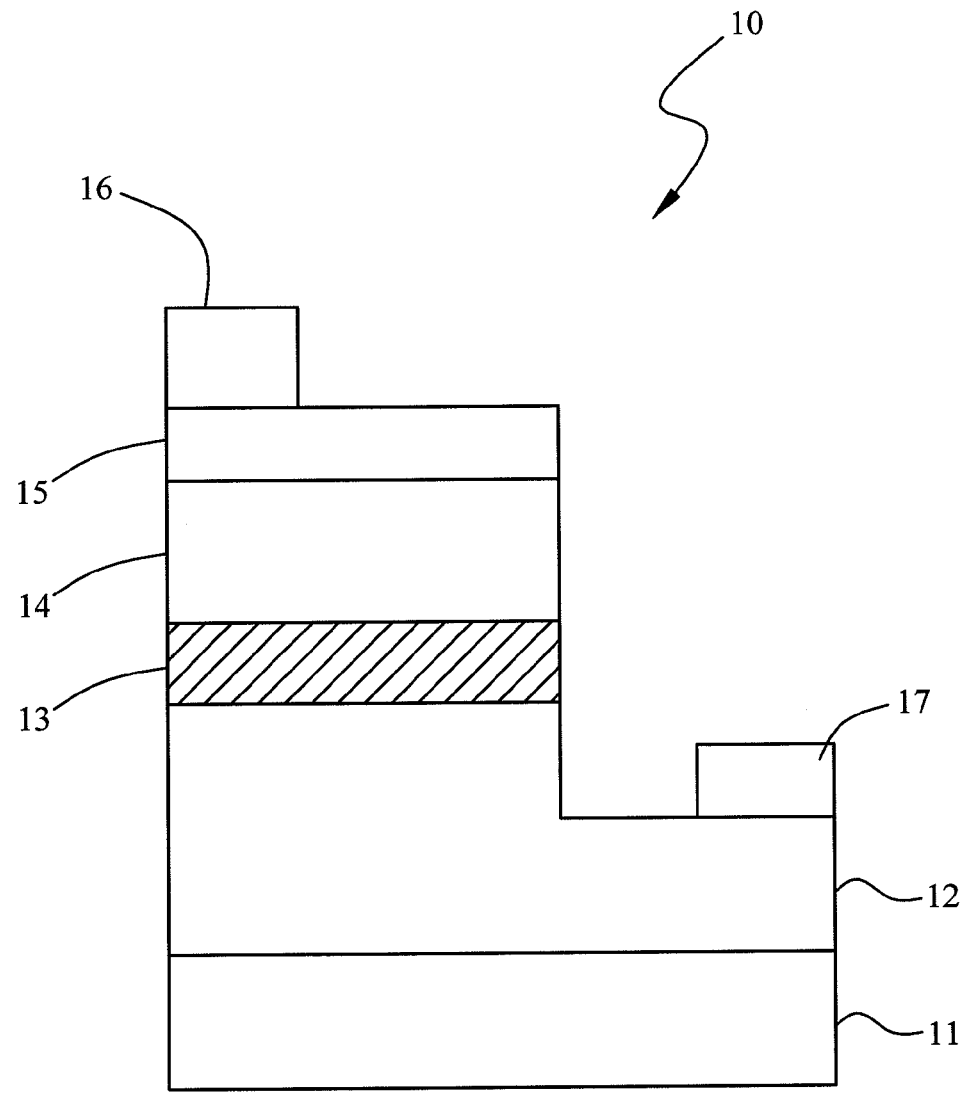
FIG. 1 is a diagram schematically showing a conventional LED structure.

Experiments are used to verify the current spreading capability of the N-type current spreading layer 23 of the present invention, wherein the conventional LED structure 10 in FIG. 1 functions as the control group and the LED structure 20 of the present invention in FIG. 2 functions as the experimental group. Comparing the current spreading effects and the sheet resistance of the N-type current spreading layer 23 respectively in the conventional LED structure 10 and the LED structure 20 under identical conditions. The related parameters and the test results are listed in Table.1. It is found that the sheet resistance of the N-type semiconductor layer 22 with the N-type current spreading layer 23 is only about 20% of that of the N-type semiconductor layer 22 without the N-type current spreading layer 23.

TABLE 1

| | Control group | Experimental group |
|---|---|---|
| P-type semiconductor layer | GaN (0.2 μm) | GaN (0.2 μm) |
| Light emitting layer | $In_{0.16}Ga_{0.84}N$ | $In_{0.16}Ga_{0.84}N$ |
| N-type semiconductor layer | GaN (3 μm) | GaN (3 μm) |
| N-type current spreading layer | nil | ($Al_{0.1}Ga_{0.9}N$/GaN/$In_{0.07}Ga_{0.93}N$) (30 nm/20 nm/15 nm) |
| Sheet resistance (ohm/sq) | 50 | 10.4 |

Figure 4A:
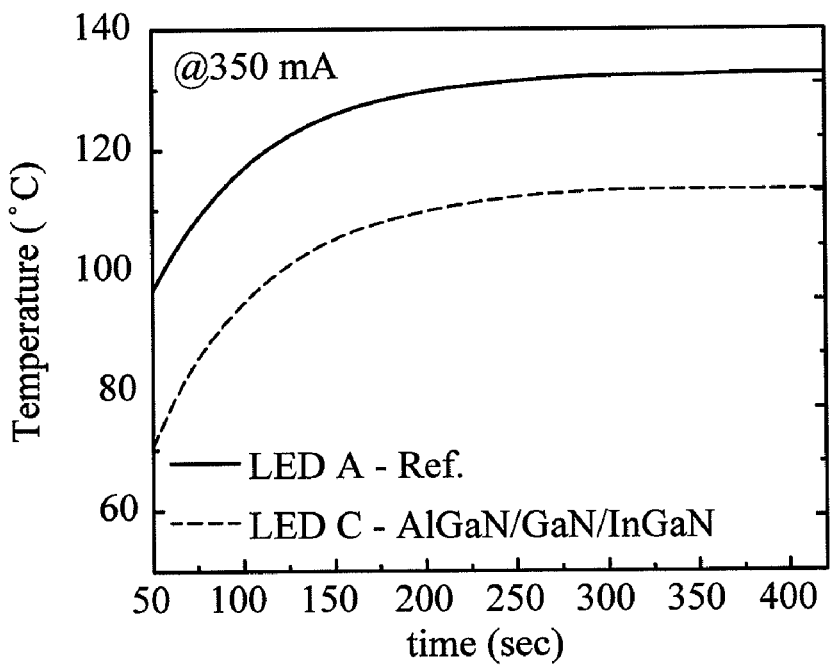
FIG. 4A and FIG. 4B are diagrams showing the comparisons between the conventional LED structure and an LED structure of the present invention.
Figure 4B:
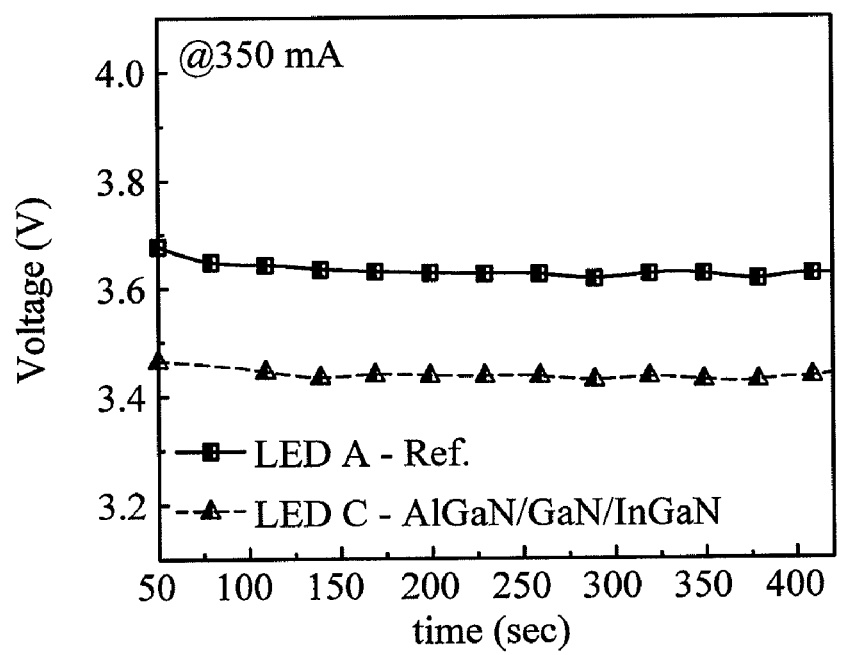

Refer to FIG. 4A and FIG. 4B diagrams showing the variations of the junction temperature and the operation voltage of the control group and the experimental group. It is found that after the N-type current spreading layers 23 is added, the operation voltage of the total LED structure can be decreased and the junction temperature can be lowered. Thus, the present invention outperforms the conventional technology in power efficiency. Further, the present invention can also increase the light emitting efficiency of overall LED structure because of uniform current distribution.

Figure 5:
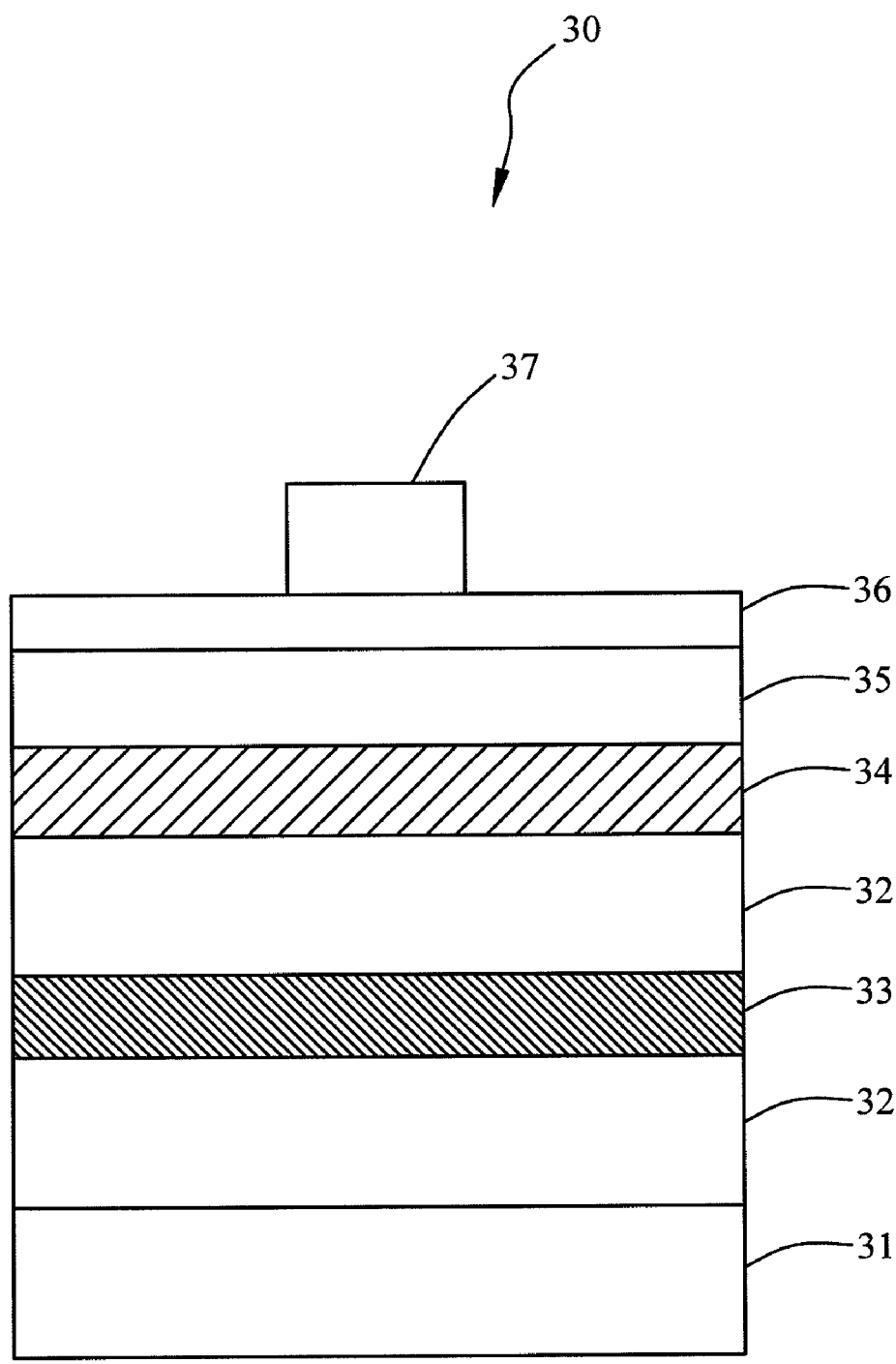
FIG. 5 is a diagram schematically showing an LED structure according to yet another embodiment of the present invention.

Refer to FIG. 5 a diagram schematically showing an LED structure according to yet another embodiment of the present invention. The present invention also can be applied to a vertical LED structure 30. The vertical LED structure 30 comprises a substrate 31, an N-type semiconductor layer 32, an N-type current spreading layer 33, a light emitting layer 34, a P-type semiconductor layer 35, a P-type current spreading layer 36, and a first electrode 37. The N-type semiconductor layer 32 is formed on the substrate 31. The N-type current spreading layer 33 is formed between the N-type semiconductor layers 32, and the structure thereof has been described hereinbefore. The light emitting layer 34 is formed on the N-type semiconductor layer 32. The P-type semiconductor layer 35 is formed on the light emitting layer 34. The P-type current spreading layer 36 is formed on the P-type semiconductor layer 35. The first electrode 37 is formed on the P-type current spreading layer 36. The substrate 31 is a conductive semiconductor. When an operation voltage is applied to the substrate 31 and the first electrode 37, the LED structure 30 emits light. The substrate 31 is made of a conductive material selected from a group consisting of silicon carbide (SiC), zinc oxide (ZnO), silicon (Si), gallium phosphide (GaP), gallium arsenide (GaAs), zinc selenide (ZnSe), indium phosphide (InP), and a silicon-doped conductive gallium nitride (GaN).

The embodiments described above are only to exemplify the present invention but not to limit the scope of the present invention. Any equivalent modification or variation according to the specification or drawings of the present invention is to be also included within the scope of the present invention.

What is claimed is:

1. A light emitting diode structure, comprising:
a substrate;
an N-type semiconductor layer formed on the substrate;
a light emitting layer formed on the N-type semiconductor layer; and
a P-type semiconductor layer formed on the light emitting layer, wherein the N-type semiconductor layer includes at least one N-type current spreading layer able to uniformly distribute current flowing through the N-type semiconductor layer; the N-type current spreading layer further includes at least three sub-layers, each sub-layer is expressed by a general formula $In_xAl_yGa_{(1-x-y)}N$, and wherein $0 \leq x \leq 1$, $0 \leq y \leq 1$, and $0 \leq x+y \leq 1$; the three sub-layers are stacked in a sequence of from a lower band gap to a higher band gap, and the sub-layer having the lower band gap is near the substrate, and the sub-layer having the higher band gap is near the light emitting layer.

2. The light emitting diode structure according to claim 1 further comprising an electrode formed on an exposed surface of the N-type semiconductor layer, wherein a junction is formed between the electrode and the exposed surface, and the N-type current spreading layer is arranged above the junction.

3. The light emitting diode structure according to claim 1, wherein the N-type current spreading layer includes three sub-layers which are an indium gallium nitride layer, a gallium nitride layer, and an aluminum gallium nitride layer stacked from the lower band gap to the higher band gap.

4. The light emitting diode structure according to claim 1, wherein the N-type current spreading layer is a silicon-doped structure.

5. The light emitting diode structure according to claim 1, wherein the N-type current spreading layer is an un-doped structure.

6. The light emitting diode structure according to claim 1, wherein the N-type current spreading layer has a thickness of 1 nm-200 nm.

7. The light emitting diode structure according to claim 1 further comprising a buffer layer formed between the substrate and the N-type semiconductor layer.

8. The light emitting diode structure according to claim 7, wherein the buffer layer has a thickness of 1 nm-2000 nm.

9. The light emitting diode structure according to claim 1, wherein the substrate is made of a material selected from a group consisting of aluminum oxide, aluminum nitride, gallium nitride, magnesium oxide, zinc oxide, silicon carbide, silicon, lithium gallate, and lithium aluminate.

* * * * *